United States Patent
Maruyama

(10) Patent No.: US 9,945,895 B2
(45) Date of Patent: Apr. 17, 2018

(54) ANTENNA CHECKING CIRCUIT

(71) Applicant: ALPS ELECTRIC CO., LTD., Ota-ku, Tokyo (JP)

(72) Inventor: Takashi Maruyama, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 254 days.

(21) Appl. No.: 14/585,412

(22) Filed: Dec. 30, 2014

(65) Prior Publication Data

US 2015/0212141 A1    Jul. 30, 2015

(30) Foreign Application Priority Data

Jan. 29, 2014  (JP) ................................ 2014-014554

(51) Int. Cl.
| | |
|---|---|
| *G01R 27/08* | (2006.01) |
| *G01R 31/02* | (2006.01) |
| *G01R 27/00* | (2006.01) |

(52) U.S. Cl.
CPC ........... *G01R 31/026* (2013.01); *G01R 27/00* (2013.01)

(58) Field of Classification Search
CPC .... G01R 31/026; G01R 27/00; G01R 31/024; G01R 31/04; G01R 31/041
USPC ........ 307/130; 324/253, 527, 529, 530, 691, 324/76.11, 523, 537, 538; 343/703; 455/115.1, 115.2; 340/649, 652; 375/316
See application file for complete search history.

(56) References Cited

U.S. PATENT DOCUMENTS

| | | | | |
|---|---|---|---|---|
| 2011/0058628 | A1* | 3/2011 | Hsieh ....................... | H04B 1/18 375/316 |
| 2013/0082869 | A1* | 4/2013 | Jaeger ................... | G01S 7/4052 342/165 |

FOREIGN PATENT DOCUMENTS

| | | |
|---|---|---|
| JP | P2008-219540 | 9/2008 |
| JP | 2010-010841 | 1/2010 |
| JP | P2010-139308 | 6/2010 |

\* cited by examiner

*Primary Examiner* — Arleen M Vazquez
*Assistant Examiner* — Steven Yeninas
(74) *Attorney, Agent, or Firm* — Hunton & Williams LLP

(57) ABSTRACT

An antenna checking circuit includes an antenna-connection-input terminal, a check-request-input terminal, a check-result-output terminal, a switching element having a control end connected to the check-request-input terminal, an input end connected to the antenna-connection-input terminal, and an output end connected to the check-result-output terminal, and a first resistance connected between the check-request-input terminal and the check-result-output terminal. A DC impedance of an antenna between a power supplying point and a ground point is 0Ω, and when a high-level check-request signal is applied to the check-request-input terminal, in a case where the antenna is connected to an antenna-connection terminal, the switching element turns on, and in a case where the antenna is not connected to the antenna-connection terminal, the switching element turns off. Check-result signals that are output to the check-result-output terminal in these cases are different from each other.

3 Claims, 5 Drawing Sheets

FIG. 4

|  |  | ANT 51 IS CONNECTED ||  ANT 51 IS NOT CONNECTED ||
|---|---|---|---|---|---|
|  |  | TR17 | CHECK-RESULT OUTPUT TERMINAL 3 | TR17 | CHECK-RESULT OUTPUT TERMINAL 3 |
| CHECK-REQUEST INPUT TERMINAL 2 | LOW IN NORMAL STATE | OFF | LOW | OFF | LOW |
|  | HI DURING CHECKING | ON | LOW | OFF | HI |

ANTENNA CHECKING CIRCUIT

CLAIM OF PRIORITY

This application contains subject matter related to and claims the benefit of Japanese Patent Application No. 2014-014554 filed on Jan. 29, 2014, the entire contents of which is incorporated herein by reference.

BACKGROUND OF THE DISCLOSURE

1. Field of the Disclosure

Embodiments of the present invention relate to an antenna checking circuit that is built in a communication device, to which an antenna is connected, and that checks the connection state of the antenna.

2. Description of the Related Art

In a communication device that is used in a wireless local area network (LAN) system or the like that is installed in a vehicle or the like, it is important that an antenna is properly connected to the communication device in order to transmit and receive radio waves in an optimal way. An antenna checking circuit that checks whether the connection state of an antenna is normal may sometimes be incorporated in such a communication device.

FIG. 5 illustrates an example of such a communication device of the related art. A wireless communication device 900 described in Japanese Unexamined Patent Application Publication No. 2010-010841 is a wireless communication device in which an antenna 910, which has a power supplying point connected to a terminal 912 and receives incoming radio waves, and a receiver 930 are connected by a signal line 952. The wireless communication device 900 includes a signal analysis unit 932 that includes direct-current (DC) signal applying means configured to apply a DC signal to the signal line 952 via an internal resistance 942. During operation of the DC signal applying means, whether breaking of the signal line 952 or a connection failure has occurred is checked by determining whether the voltage at one end of the internal resistance 942 on the side opposite to the side on which the DC signal applying means is disposed, that is, the voltage at an output terminal 943, is equal to or greater than a threshold. Since the wireless communication device 900 is configured as described above, breaking of the signal line 952 and a connection failure of the antenna 910 can be appropriately checked.

However, in the wireless communication device 900, an antenna that does not have a ground point is assumed to be used as the antenna 910, which is connected to the terminal 912, and in the case where an antenna that has a ground point and whose DC impedance between a power supplying point and the ground point is 0Ω, for example, an inverted F-shaped antenna, is connected to the terminal 912, the connection state of such an antenna cannot be precisely checked.

These and other drawbacks exits.

SUMMARY OF THE DISCLOSURE

Embodiments of the present disclosure provide an antenna checking circuit capable of precisely checking the connection state of an antenna that has a ground point and whose DC impedance between a power supplying point and the ground point is 0Ω, in the case where such an antenna is connected to an antenna-connection terminal.

An antenna checking circuit according to an embodiment is an antenna checking circuit built in a communication device, which has an antenna-connection terminal, and configured to check a connection state of an antenna, and the antenna checking circuit includes an antenna-connection-input terminal connected to the antenna-connection terminal, a check-request-input terminal to which a high-level or low-level check-request signal is input, a check-result-output terminal to which check results are output, a switching element having a control end connected to the check-request-input terminal, an input end connected to the antenna-connection-input terminal, and an output end connected to the check-result-output terminal, and a first resistance connected between the check-request-input terminal and the check-result-output terminal. The antenna has a ground point, and a DC impedance between a power supplying point and the ground point is 0Ω. When the high-level check-request signal is applied to the check-request-input terminal, in a case where the antenna is connected to the antenna-connection terminal, the switching element turns on, and a low-level signal is output to the check-result-output terminal, and in a case where the antenna is not connected to the antenna-connection terminal, the switching element turns off, and a high-level signal is output to the check-result-output terminal.

Therefore, the connection state of the antenna, whose DC impedance between the power supplying point and the ground point is 0Ω, can be precisely checked.

In an antenna checking circuit according various embodiments, the switching element may be a bipolar transistor having an emitter as the input end and a collector as the output end.

Therefore, in the case where a high voltage greater than a power supply voltage is accidentally applied to the antenna-connection terminal, the high voltage is blocked by the transistor and will not be applied to circuits in the communication device, and thus, the circuits in the communication device can be protected.

In an antenna checking circuit according an embodiments, the collector may be connected to the check-result-output terminal, a second resistance having a resistance value smaller than a resistance value of the first resistance may be connected between the emitter and the antenna-connection-input terminal, and a third resistance having a resistance value greater than the resistance value of the second resistance may be connected between a base of the transistor and the check-request-input terminal.

In the antenna checking circuit configured as described above, since only three resistances and one transistor are used as the circuit components, the antenna checking circuit can be realized with a small-scale circuit layout.

BRIEF DESCRIPTION OF THE DRAWINGS

FIG. 4 is a table showing states of a switching element and check results according to embodiments of the present disclosure.

DETAILED DESCRIPTION OF THE DISCLOSURE

The following description is intended to convey a thorough understanding of the embodiments described by providing a number of specific embodiments and details involving an antenna checking circuit. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
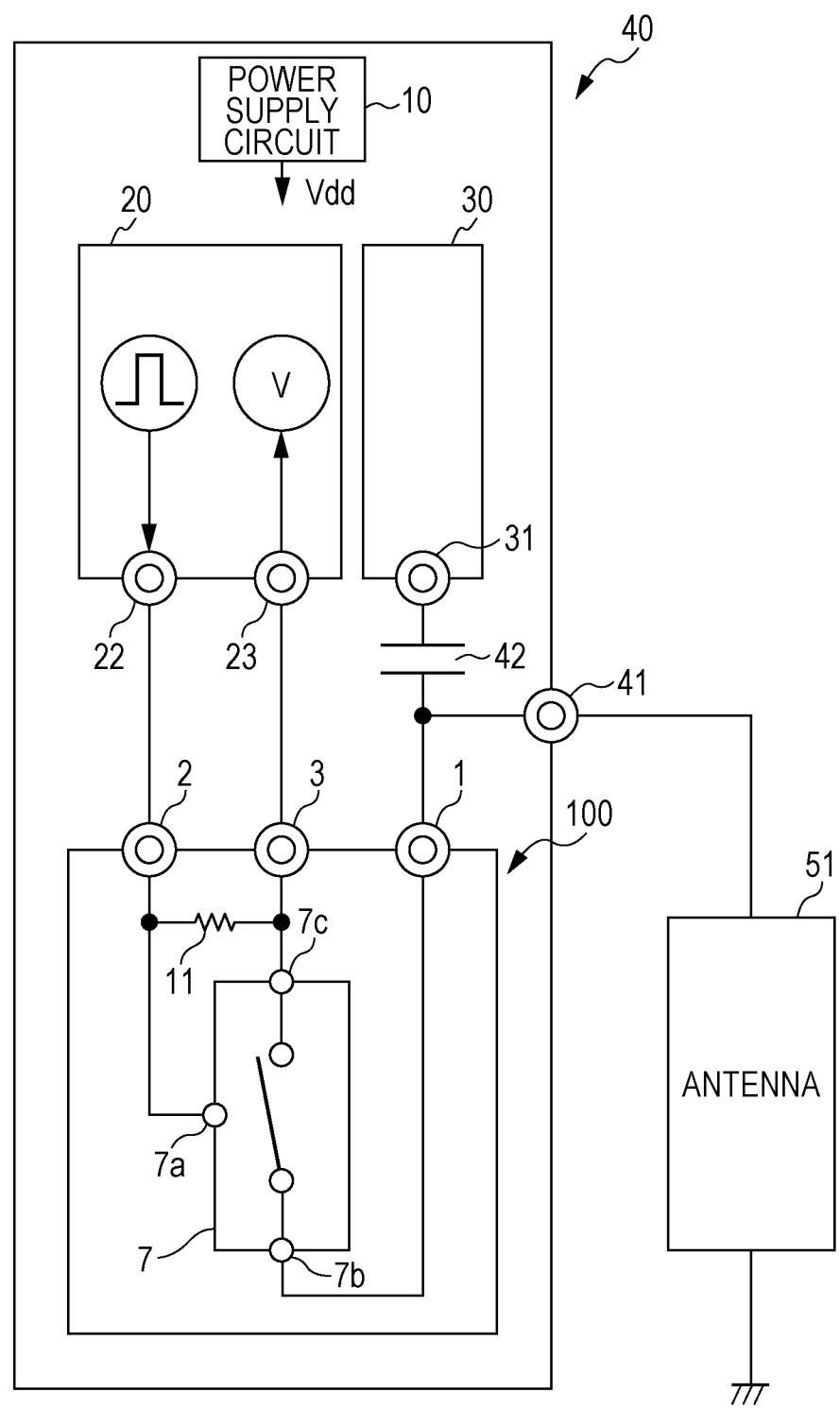
FIG. 1 is a circuit diagram illustrating an antenna checking circuit according to an embodiment of the present disclosure.
Figure 2:
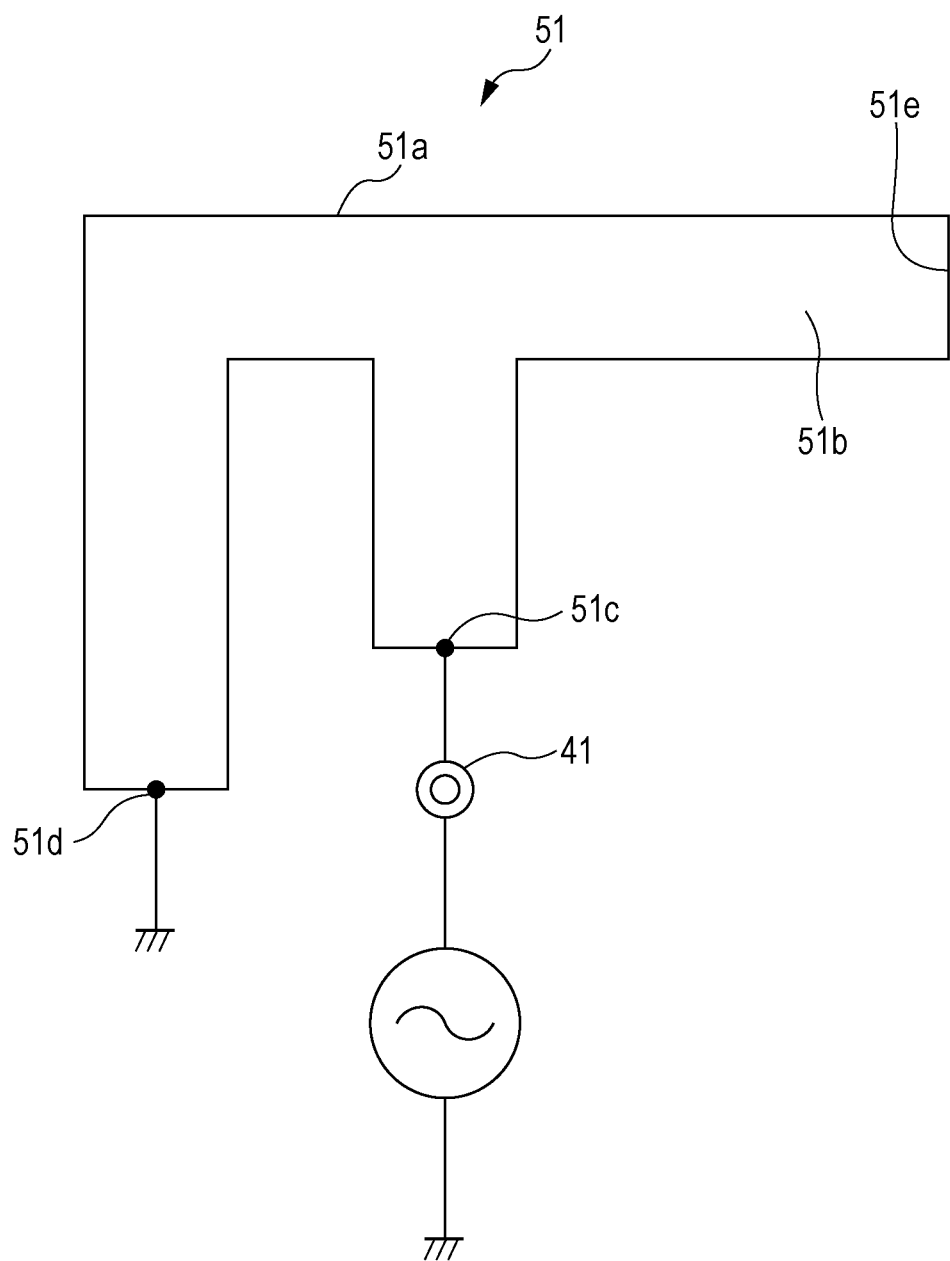
FIG. 2 is a schematic diagram illustrating the configuration of an antenna according to an embodiment of the present disclosure.
Figure 3:
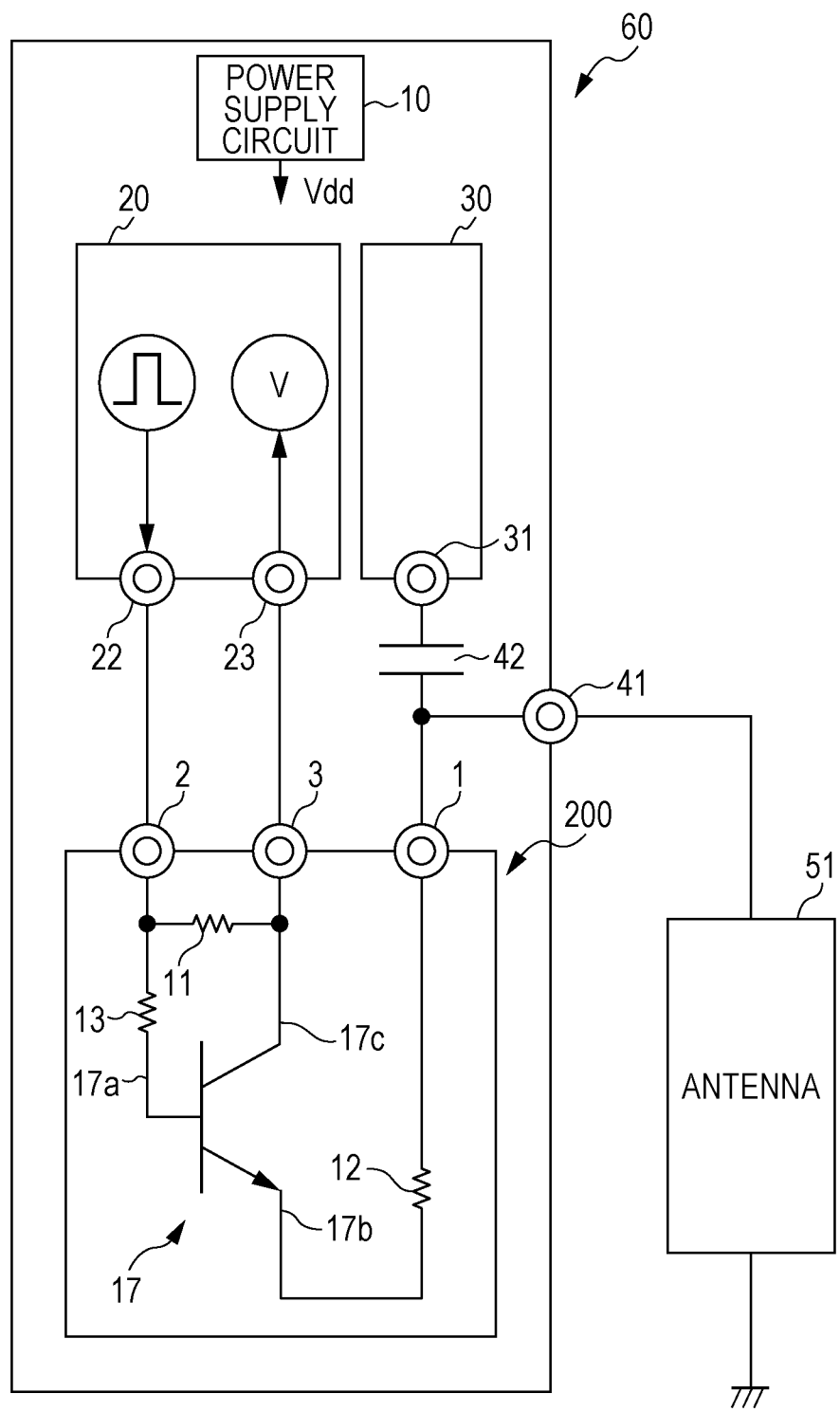
FIG. 3 is a circuit diagram illustrating an antenna checking circuit according to an embodiment of the present disclosure.
Figure 5:
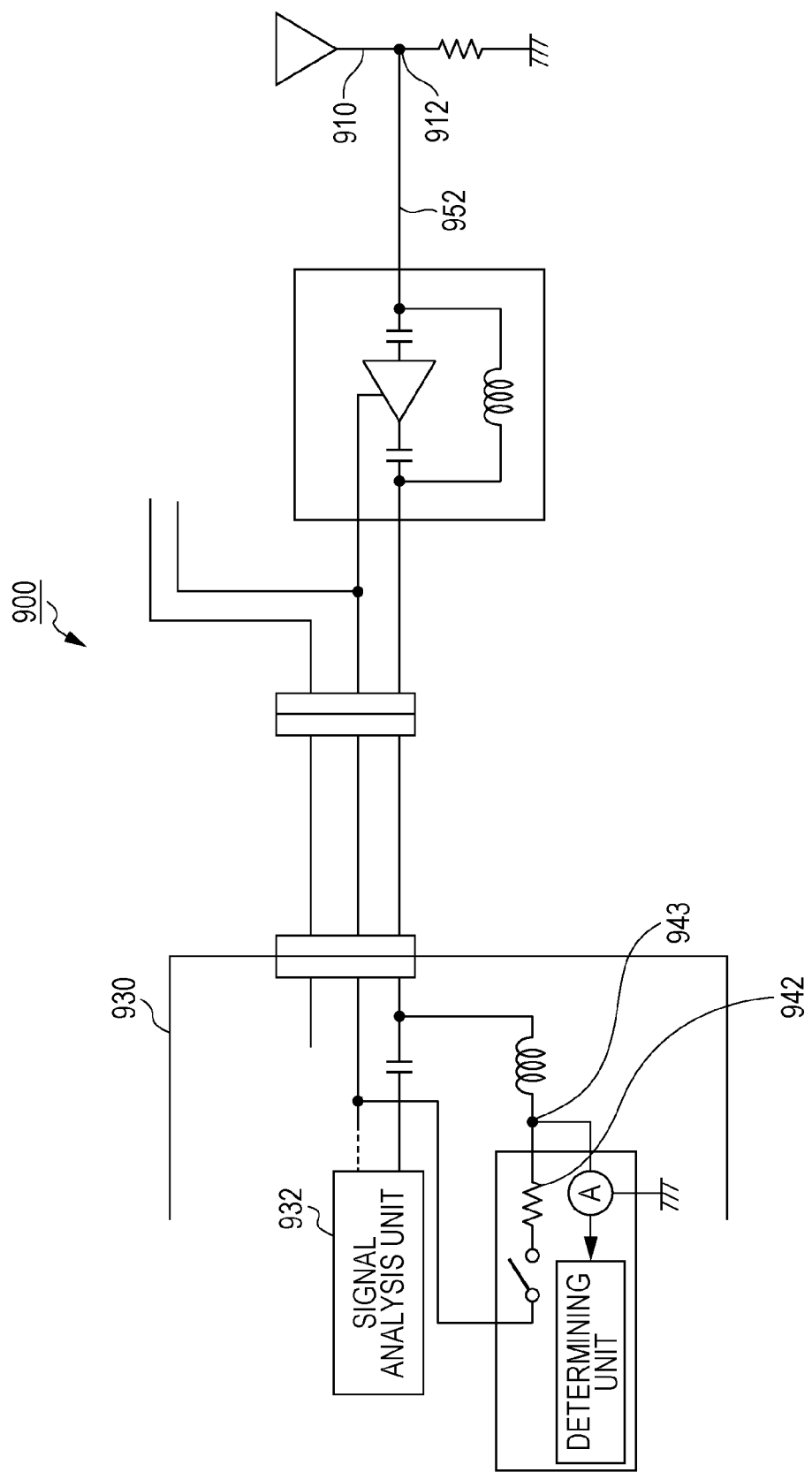
FIG. 5 is a block diagram illustrating a wireless communication device of the related art.

FIG. 1 is a circuit diagram illustrating an antenna checking circuit 100 according to an example embodiment of the disclosure and is a block diagram illustrating a communication device 40 in which the antenna checking circuit 100 is built. FIG. 2 is a schematic diagram illustrating the configuration of an example antenna 51. FIG. 3 is a circuit diagram illustrating an antenna checking circuit 200 according to an example embodiment of the disclosure and is a block diagram illustrating an example communication device 60 in which the antenna checking circuit 200 is built. FIG. 4 is a table showing states of a transistor 17, which is illustrated in FIG. 3, and check results.

As illustrated in FIG. 1, the antenna checking circuit 100 may be built in the communication device 40. In addition to the antenna checking circuit 100, communication device 40 may include a power supply circuit 10, an antenna-connection-state-determining circuit 20, and a communication circuit 30.

The communication device 40 may include an antenna-connection terminal 41, and the antenna 51 whose connection state is to be checked is connected to the antenna-connection terminal 41. The communication circuit 30 may include a high-frequency input/output terminal 31, and the high-frequency input/output terminal 31 may be connected to the antenna-connection terminal 41 via a capacitor 42. The communication circuit 30 may be formed of a semiconductor element (not illustrated) and the like and configured so as to be capable of performing transmission and reception with other communication devices. The capacitor 42 that is connected between the antenna-connection terminal 41 and the high-frequency input/output terminal 31 blocks DC-connections between the communication circuit 30 and the antenna checking circuit 100 and between the communication circuit 30 and the antenna 51.

The antenna-connection-state-determining circuit 20 may include a check-request-output terminal 22 and a check-result-input terminal 23. The antenna-connection-state-determining circuit 20 may be formed of a semiconductor element (not illustrated) and the like and may apply a high-level voltage or low-level voltage check-request signal to the antenna checking circuit 100 from the check-request-output terminal 22 in such a manner as to cause the antenna checking circuit 100 to check the connection state of the antenna 51. The antenna-connection-state-determining circuit 20 can determine the connection state of the antenna 51 by sensing the level of a check-result signal that is input to the check-result-input terminal 23.

The antenna checking circuit 100 may include an antenna-connection-input terminal 1 that may be connected to the antenna-connection terminal 41, a check-request-input terminal 2 to which a high-level voltage or low-level voltage check-request signal is input from the check-request-output terminal 22 of the antenna-connection-state-determining circuit 20, and a check-result-output terminal 3 to which a check-result signal, which is obtained through a checking process, is output.

The antenna checking circuit 100 may include a switching element 7, which may have a control end 7a, an input end 7b, an output end 7c, and a first resistance 11. In the switching element 7, the control end 7a, the input end 7b, and the output end 7c respectively may be connected to the check-request-input terminal 2, the antenna-connection-input terminal 1, and the check-result-output terminal 3. The switching element 7 may be an element that turns on when the voltage difference between the control end 7a and the input end 7b becomes equal to or greater than a predetermined voltage difference and turns off when the voltage difference between the control end 7a and the input end 7b falls below the predetermined voltage difference. The first resistance 11 may be connected between the check-request-input terminal 2 and the check-result-output terminal 3.

A power supply voltage Vdd may be supplied to the antenna-connection-state-determining circuit 20 and the communication circuit 30 by the power supply circuit 10. For example, a voltage of 5 V, 3.5 V, or the like is selected as the voltage of the power supply voltage Vdd. Note that the antenna checking circuit 100 may be configured in such a manner that the power supply voltage Vdd does not need to be supplied to the antenna checking circuit 100 by the power supply circuit 10.

As illustrated in FIG. 2, the antenna 51 may be an inverted F-shaped antenna 51a. The inverted F-shaped antenna 51a may include an antenna conductive portion 51b formed of a metal conductor, a power supplying point 51c, a ground point 51d, and an open end 51e. Power may be supplied to the power supplying point 51c from the antenna-connection terminal 41, and the inverted F-shaped antenna 51a may be grounded at the ground point 51d. The antenna 51, which may be the inverted F-shaped antenna 51a, may have a predetermined characteristic impedance and may be configured in such a manner that matching of the antenna 51 and the communication circuit 30 is achieved. Note that the power supplying point 51c and the ground point 51d may be connected by the metal conductor, which forms the antenna conductive portion 51b, and thus, the DC impedance of the antenna 51 between the power supplying point 51c and the ground point 51d is 0Ω. In other words, when the antenna 51 is connected to the antenna-connection terminal 41, the antenna-connection terminal 41 is DC-grounded.

In the case of checking the connection state of the antenna 51, a high-level voltage check-request signal may be applied to the check-request-input terminal 2 from the check-request-output terminal 22 of the antenna-connection-state-determining circuit 20. In the case of not checking the connection state of the antenna 51, that is, in a normal state, a low-level voltage check-request signal may be applied to the check-request-input terminal 2 from the check-request-output terminal 22 of the antenna-connection-state-determining circuit 20. Thus, in the case of checking the connection state of the antenna 51, the voltage at the control end 7a of the switching element 7 may be a high-level voltage. Note that the high-level voltage may be a voltage equal to or greater than a predetermined threshold, and the low-level voltage is a voltage below the predetermined threshold. More specifically, the high-level voltage may be set to a voltage that can be clearly determined as high level, for example, a voltage that is equal to or close to the power supply voltage Vdd. The voltage of the low-level voltage check-request signal may be set to a voltage that can be clearly determined as low level, for example, a voltage that is equal to or close to a ground voltage.

In the case where the antenna 51 is connected to the antenna-connection terminal 41, the voltage at the input end 7b of the switching element 7 may be equal to the ground voltage because the DC impedance of the antenna 51 between the power supplying point 51c and the ground point 51d, that is, the DC impedance on the side on which the antenna 51 is disposed when viewed from the input end 7b, is 0Ω. The switching element 7 may be an element that turns on when the voltage at the control end 7a is a high-level voltage and the voltage at the input end 7b is a low-level voltage, that is, when the voltage difference between the control end 7a and the input end 7b is equal to or greater than a predetermined voltage difference, and thus, in the case where the antenna 51 is connected to the antenna-connection terminal 41, the switching element 7 is in an ON state. Therefore, a voltage close to the ground voltage may be supplied to the output end 7c of the switching element 7 via the antenna 51, and thus, a low-level voltage signal is output to the check-result-output terminal 3.

On the other hand, in the case where the antenna 51 is not connected to the antenna-connection terminal 41, the input end 7b of the switching element 7 may be in an open state, and thus, a voltage difference will not be generated between the control end 7a and the input end 7b. The switching element 7 may be an element that turns off when the voltage difference between the control end 7a and the input end 7b falls below the predetermined voltage difference, and thus, in the case where the antenna 51 is not connected to the antenna-connection terminal 41, the switching element 7 is in an OFF state. Therefore, the high-level voltage that has been applied to the check-request-input terminal 2 appears at the output end 7c of the switching element 7 via the first resistance 11. Accordingly, a high-level voltage signal is output to the check-result-output terminal 3.

Note that, in the case of not checking the connection state of the antenna 51, that is, in the normal state, as described above, the low-level voltage check-request signal may be applied to the check-request-input terminal 2 from the check-request-output terminal 22 of the antenna-connection-state-determining circuit 20. In this case, the voltage of the control end 7a at the switching element 7 may be a low-level voltage, and the switching element 7 may be constantly in the OFF state. As a result, the low-level voltage signal may be output to the check-result-output terminal 3 via the first resistance 11, and the low-level voltage signal may be input to the check-result-input terminal 23 of the antenna-connection-state-determining circuit 20.

As described above, the antenna checking circuit 100 may be configured in such a manner that, when the high-level voltage check-request signal is applied to the check-request-input terminal 2, in the case where the antenna 51 is connected to the antenna-connection terminal 41, the low-level voltage is output to the check-result-output terminal 3 via the antenna 51, and in the case where the antenna 51 is not connected to the antenna-connection terminal 41, the high-level voltage is supplied to the check-result-output terminal 3 via the first resistance 11. Therefore, the connection state of the antenna 51 whose DC impedance between the power supplying point 51c and the ground point 51d is 0Ω can be precisely checked.

The configuration of the antenna checking circuit 200 in which the transistor 17 is used as a switching element and the configuration of the communication device 60 in which the antenna checking circuit 200 is built will now be described with reference to FIG. 3. Note that the configuration of the communication device 60, excluding the antenna checking circuit 200, and the configuration of the antenna 51 may be similar to the configuration of the communication device 40 illustrated in FIG. 1 and the configuration of the antenna 51 illustrated in FIG. 2, respectively. Therefore, the components of the communication device 60 that are similar to those of the communication device 40 are denoted by the same reference numerals, and descriptions thereof have been omitted.

As illustrated in FIG. 3, the antenna checking circuit 200 may include the first resistance 11, a second resistance 12, a third resistance 13, and the transistor 17, which may serve as a switching element. The transistor 17 may be a bipolar transistor that includes a base 17a as a control end, an emitter 17b as an input end, and a collector 17c as an output end.

In the antenna checking circuit 200, the first resistance 11 may be connected between the check-request-input terminal 2 and the check-result-output terminal 3. The collector 17c may be connected to the check-result-output terminal 3, the second resistance 12 may be connected between the emitter 17b and the antenna-connection-input terminal 1, and the third resistance 13 may be connected between the base 17a and the check-request-input terminal 2.

In such an embodiment, regarding the resistance values of the first resistance 11, the second resistance 12, and the third resistance 13, in order to enable the transistor 17 to perform an appropriate switching operation, the resistance value of the second resistance 12 may be set to be smaller than the resistance value of the first resistance 11, and the resistance value of the third resistance 13 may be set to be larger than the resistance value of the second resistance 12. For example, the resistance value of the second resistance 12 may be set to be smaller than or equal to about one-tenth of the resistance value of the first resistance 11 in such a manner that the voltage at the check-result-output terminal 3, that is, the voltage that is divided by the first resistance 11 and the second resistance 12, is close to the ground voltage when the transistor 17 turns on. In addition, the resistance value of the third resistance 13 may be set to be equal to or greater than about 10 times the resistance value of the second resistance 12 in order to reduce current consumption when the transistor 17 is in the ON state.

In the case of checking the connection state of the antenna 51, a high-level voltage check-request signal may be applied to the check-request-input terminal 2 from the check-request-output terminal 22 of the antenna-connection-state-determining circuit 20. Thus, in this case, the voltage at the base 17a is a high-level voltage.

In the case where the antenna 51 is connected to the antenna-connection terminal 41, the DC impedance of the antenna 51 illustrated in FIG. 2 between the power supplying point 51c and the ground point 51d is 0Ω, and thus, the antenna-connection terminal 41 is grounded. Thus, the emitter 17b is grounded via the second resistance 12. Since the voltage at the base 17a is a high-level voltage, the transistor 17 is in the ON state. Therefore, in the case where the antenna 51 is connected to the antenna-connection terminal 41, the voltage at the collector 17c is approximately the same as the ground voltage, that is, a low-level voltage, and a low-level voltage signal is output to the check-result-output terminal 3.

On the other hand, in the case where the antenna 51 is not connected to the antenna-connection terminal 41, the emitter 17b of the transistor 17 is in an open state, and thus, a voltage difference will not be generated between the base 17a and the emitter 17b. Thus, in the case where the antenna 51 is not connected to the antenna-connection terminal 41, the transistor 17 is in the OFF state. Therefore, the high-level voltage that has been applied to the check-request-input terminal 2 appears at the collector 17c via the first resistance 11. Accordingly, a high-level voltage signal is output to the check-result-output terminal 3.

Note that, in the case of not checking the connection state of the antenna 51, that is, in the normal state, a low-level voltage check-request signal is applied to the check-request-input terminal 2 from the check-request-output terminal 22 of the antenna-connection-state-determining circuit 20. In this case, the voltage at the base 17a of the transistor 17 is a low-level voltage, and thus, the transistor 17 is constantly in the OFF state. Therefore, the low-level voltage that has been applied to the check-request-input terminal 2 appears at the collector 17c via the first resistance 11. Accordingly, a low-level voltage signal is output to the check-result-output terminal 3.

As shown in the table in FIG. 4, in the case of not checking the connection state of the antenna 51, that is, in the normal state, a low-level voltage check-request signal (Low) is input to the check-request-input terminal 2. In this case, the transistor 17 is in the OFF state, and a low-level voltage check-output signal (Low) is output to the check-result-output terminal 3. Therefore, regardless of whether or not the antenna 51 is connected to the antenna-connection terminal 41, when the low-level voltage check-request signal (Low) is input to the check-request-input terminal 2, the low-level voltage check-output signal (Low) is output to the check-result-output terminal 3.

As shown in the table in FIG. 4, in the case of checking the connection state of the antenna 51, a high-level voltage check-request signal (Hi) is input to the check-request-input terminal 2. In the case where the antenna 51 is connected to the antenna-connection terminal 41 while the high-level voltage check-request signal (Hi) is input to the check-request-input terminal 2, the transistor 17 is in the ON state, and the low-level voltage check-output signal (Low) is output to the check-result-output terminal 3. In the case where the antenna 51 is not connected to the antenna-connection terminal 41 while the high-level voltage check-request signal (Hi) is input to the check-request-input terminal 2, the transistor 17 is in the OFF state, and a high-level voltage check-output signal (Hi) is output to the check-result-output terminal 3.

As described above, in the case of checking the connection state of the antenna 51, the high-level voltage check-request signal (Hi) is input to the check-request-input terminal 2, and in the case where the voltage level of the signal at the check-result-output terminal 3 is low level (Low), it can be determined that the antenna 51 is connected to the antenna-connection terminal 41. In the case where the voltage level of the signal at the check-result-output terminal 3 is high-level (Hi) while the high-level voltage check-request signal (Hi) is input to the check-request-input terminal 2, it can be determined that the antenna 51 is not connected to the antenna-connection terminal 41.

In the case where the communication device 60 is a communication device to be mounted in a vehicle, there is a possibility that the voltage of a battery to be mounted in a vehicle, for example, a battery voltage of 12 V, may be accidentally applied to the antenna-connection terminal 41. In this case, a high voltage greater than the power supply voltage Vdd (e.g., 3.5 V or 5 V) of the communication device 60 will be applied to the antenna-connection-input terminal 1 of the antenna checking circuit 200, which is illustrated in FIG. 3. If such a high voltage is applied as is to the antenna-connection-state-determining circuit 20 and the communication circuit 30 in the communication device 60, the semiconductor elements and the like in the circuits can be damaged.

However, the switching element in the antenna checking circuit 200 is formed of the transistor 17, and the emitter 17b and the collector 17c are respectively connected to the antenna-connection-input terminal 1 and the check-result-output terminal 3. This configuration can be assumed to be equivalent to a configuration in which a diode whose cathode is connected to the antenna-connection-input terminal 1 is interposed between the antenna-connection-input terminal 1 and the check-result-output terminal 3. Therefore, in the case where a reverse voltage is applied between the emitter 17b and the collector 17c, for example, in the case where a high voltage greater than the power supply voltage Vdd is applied to the antenna-connection-input terminal 1, this high voltage is blocked by the transistor 17.

As described above, since the bipolar transistor 17, which includes the emitter 17b as an input end and the collector 17c as an output end, is used as the switching element in the antenna checking circuit 200, in the case where a high voltage greater than the power supply voltage Vdd is accidentally applied to the antenna-connection terminal 41 of the communication device 60, this high voltage is blocked by the transistor 17. As a result, the high voltage greater than the power supply voltage Vdd will not be applied to the circuits in the communication device 60, and thus, the circuits in the communication device 60 can be protected.

Since only one transistor 17 and three resistances including the first resistance 11, the second resistance 12, and the third resistance 13 are used as the circuit components of the antenna checking circuit 200, the antenna checking circuit 200 can be realized with a small-scale circuit layout.

As described above, the antenna checking circuit according to the embodiments of the present disclosure is configured in such a manner that a low-level voltage is output to the check-result-output terminal via the antenna in the case where the antenna is connected to the antenna-connection terminal, and that a high-level voltage is supplied to the check-result-output terminal via the first resistance in the case where the antenna is not connected to the antenna-connection terminal, and thus, the connection state of the antenna whose DC impedance between the power supplying point and the ground point is 0Ω can be precisely checked.

The present invention is not limited to the above-described embodiments and can be implemented in various aspects in which the advantageous effects of the present invention can be provided by making suitable modifications. For example, the antenna checking circuit according to the present invention may include components equivalent to the components illustrated in FIG. 1. In addition, the antenna checking circuit according to the present invention may include other circuit components as long as the components do not obstruct the operation of the antenna checking circuit. Furthermore, instead of the bipolar transistor, a field effect transistor or the like can be used as the switching element.

The embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. An antenna checking circuit built into a communication device having an antenna-connection terminal, wherein the communication device is configured to check a connection state of an antenna, the antenna checking circuit comprising:
   an antenna-connection-input terminal connected to the antenna-connection terminal;
   a check-request-input terminal to which a high-level or low-level check-request signal is input;
   a check-result-output terminal to which check results are output;
   a switching element having a control end connected to the check-request-input terminal, an input end connected to the antenna-connection-input terminal, and an output end connected to the check-result-output terminal; and
   a first resistance connected between the check-request-input terminal and the check-result-output terminal,
   wherein the antenna has a ground point, and a DC impedance between a power supplying point and the ground point is 0Ω,
   wherein, when the high-level check-request signal is applied to the check-request-input terminal, in a case where the antenna is connected to the antenna-connection terminal, the switching element turns on, and a low-level signal is output to the check-result-output terminal, and in a case where the antenna is not connected to the antenna-connection terminal, the switching element turns off, and a high-level signal is output to the check-result-output terminal,
   wherein the switching element is a bipolar transistor having an emitter as the input end and a collector as the output end,
   wherein the collector is connected to the check-result-output terminal,
   wherein a second resistance having a resistance value smaller than a resistance value of the first resistance is connected between the emitter and the antenna-connection-input terminal, and
   wherein a third resistance having a resistance value greater than the resistance value of the second resistance is connected between a base of the transistor and the check-request-input terminal.

2. The antenna checking circuit according to claim 1, further comprising a communication circuit that includes a high-frequency input/output terminal,
   wherein the high-frequency input/output terminal is connected to the antenna-connection terminal 41 via a capacitor.

3. The antenna checking circuit according to claim 1, wherein the antenna is an inverted F-shaped antenna and includes an antenna conductive portion formed of a metal conductor, a power supplying point, a ground point, and an open end.

\* \* \* \* \*